Oct. 19, 1965 J. C. McADAM 3,213,336

TRANSISTOR HEAT DISSIPATORS

Filed Nov. 22, 1960 2 Sheets-Sheet 1

INVENTOR.
JOHN C. McADAM
BY
Beehler & Shanahan
ATTORNEYS

Oct. 19, 1965 J. C. McADAM 3,213,336

TRANSISTOR HEAT DISSIPATORS

Filed Nov. 22, 1960 2 Sheets-Sheet 2

INVENTOR.
JOHN C. McADAM
BY
Beehler & Shanahan

United States Patent Office 3,213,336
Patented Oct. 19, 1965

3,213,336
TRANSISTOR HEAT DISSIPATORS

John C. McAdam, Burbank, Calif., assignor, by mesne assignments, to International Electronic Research Corporation, a corporation of California Filed Nov. 22, 1960, Ser. No. 71,098
5 Claims. (Cl. 317—234)

This is a continuation-in-part of application Serial No. 831,427, filed August 3, 1959, now Patent No. 2,964,688.

The invention relates to heat dissipators and has special reference to dissipating devices designed for use with electronic transistors and especially transistors such as power transistors which generate an appreciable amount of heat during operation, although the device is not confined, necessarily, to transistors of this particular kind.

The handling of transistors is relatively new and the prior art, as of the present time, has had only a limited development in connection with the employment of transistors. Several factors are present which are not necessarily present when electronic tubes are used in circuits. For example, the transistor is often so constructed that the jacket of the transistor comprises one of the terminals and this must be insulated from a common mounting arrangement so that adjacent transistors do not short circuit. This factor, however, is not compatible with good heat dissipation by conduction because the factor which provides for heat dissipation by conduction, namely, metal to metal contact also provides an electric short circuit which is undesirable. Hence, if a heat conducting connection is to be employed the surfaces must be insulated by some appropriate dielectric film thin enough to transfer heat but thick enough to prevent the flow of electric energy. Such a dielectric film has been described in said co-pending patent application.

The foregoing presumes that the board upon which the transistors are mounted is a heat conducting and electrically conducting mounting board. It is possible, however, on some occasions to make use of a mounting board which is of a dielectric material or at least which is provided with a dielectric surface, so that there is no electric contact even though the close proximity of the dissipator to the board provides for a transfer of an appreciable amount of heat.

Another factor influencing the heat dissipation from transistors is the fact that transistors are such that they do not need any appreciable preheating before they begin operation. Hence, in suddenly coming up to operating temperature it is necessary in this art to provide an immediate rapid heat dissipation upon demand far greater than the demand present when electronic tubes are preheated prior to operation.

It is therefore among the objects of the invention to provide a new and improved heat dissipator for transistors which is of high capacity and capable of almost immediate peak performance.

Another object of the invention is to provide a new and improved heat dissipator for transistors which is simple in form but extremely rugged in construction, so that the cost of the insulation in view of the great numbers of transistors used in a compact arrangement may be kept relatively low.

Still another object of the invention is to provide a new and improved heat dissipator for transistors which may be built of relatively inexpensive metal, which at the same time contributes appreciably to its high efficiency, so that due to the construction and performance of the dissipator the units may be stacked close together in a limited space without impairing the necessary degree of efficiency in heat dissipation.

Still another object of the invention is to provide a new and improved heat dissipator for transistors which is equally effective whether employed to dissipate heat with or without attachment to a heat sink.

With these and other objects in view, the invention consists in the construction, arrangement and combination of the various parts of the device, whereby the objects contemplated are attained, as hereinafter set forth, pointed out in the appended claims and illustrated in the accompanying drawings.

Figure 1:
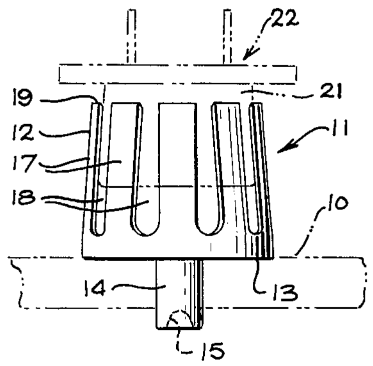
FIGURE 1 is a side elevational view of one form of transistor shown in the position it would occupy immediately prior to be attached to a mounting board and showing the location of a transistor therein in phantom lines.

In an embodiment of the invention chosen for the purpose of illustration there is shown a mounting board 10 of a conventional type such as already made reference to, which may be a good heat conductor if desired. The heat dissipator comprises a body 11 consisting of a side wall 12 and a base 13. In this instance a projection 14 of the same metallic material as the base and, incidentally, the body itself extends downwardly so as to pass entirely through the mounting board 10. The projection is provided with a hollowed end 15 for the purpose of riveting the body in mounted position. When the riveting is accomplished there will be provided a button 16 which firmly fastens the body to the mounting board.

The side wall 12 consists of a multiplicity of ribs 17 uniformly spaced apart in a circumferential direction and separated by relatively wide slots 18. The ribs are pitched inwardly in the direction of an open end 19 at the end opposite the base 13, the ribs encompassing an opening 20 for reception of a casing 21 of a transistor 22. It will be noted that the ribs 17 and also the slots 18 are longer than the overall height of the transistor casing 21 so that there is an appreciable unoccupied portion of the opening 20 at the bottom of the body. The relatively great width of the slots 18 as well as the fact that the slots extend far below the innermost end of the casing provides for an ample amount of circulation of air into the opening and around the transistor. This promotion of circulation is of material assistance to the transfer of heat by conduction from the base 13, which is relatively thick, to the mounting board through the projection 13. The firm contact of the base 13 and the projection 14 with the base promotes considerably the transfer of heat away from the transistor by conduction. The combined effect of this conduction with the circulation and, incidentally, the attendant radiation makes a transistor, the efficiency of which is substantially immediate, and which continues effective as long as there is a call for heat dissipation.

Figure 4:
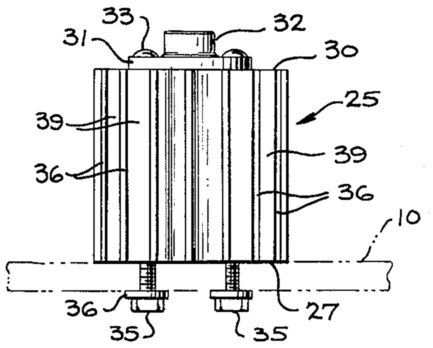
FIGURE 4 is a side elevational view of a modified form of transistor.
Figure 5:
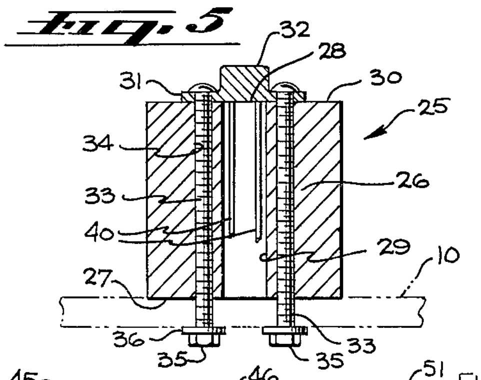
FIGURE 5 is a longitudinal sectional view of the transistor of FIGURE 4.
Figure 6:
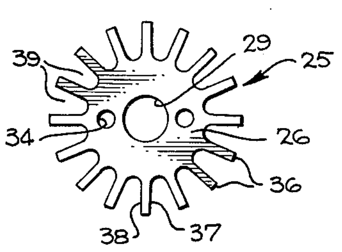
FIGURE 6 is a top view of the transistor of FIGURE 4.

In the form of invention illustrated in FIGURES 4, 5, and 6, there is provided a body 25, having a side wall 26 and a base 27. An open end 28 is at the end opposite from the base 27 and communicates with an opening 29 within the interior of the body. In this form of inventiontion a relatively flat face 30 adjacent the open end 28 provides means for mounting a flange 31 of a transistor 32 by means of screws 33 which extend through the flange 31 and thence, through appropriate bores 34 within the side wall 26, thence, outwardly from the base 27 through the mounting board 10 where they may be secured by means of conventional nuts 35 and washers 36.

In this form of invention the side wall 26 is relatively thick throughout its entire length and is in considerable mass thereby providing an extremely effective means of drawing heat away from the transistor 32 as well as accumulating the heat for passage by conduction to the mounting board 10.

The side wall 26, moreover, is provided with a multiplicity of circumferentially spaced ribs 36 which extend radially outwardly and have opposite parallel faces 37 and 38. Between the ribs are spaces 39 appreciably wider than the ribs, and having substantially the depth of the ribs or slightly in excess thereof. The size of the spaces makes it possible for air circulating around the side wall to readily reach the relatively thick portion of the side wall as well as to circulate freely in communication with the faces 37 and 38, whereby considerable heat may be picked up for dissipation, thereby, to assist materially the cooling of the relatively great mass of the transistor body. Moreover, the presence of the opening 29 assists materially in the handling of the heat as well as in providing a passage whereby leads 40 of the transistor may be extended downwardly through the mounting board 10.

Figure 2:
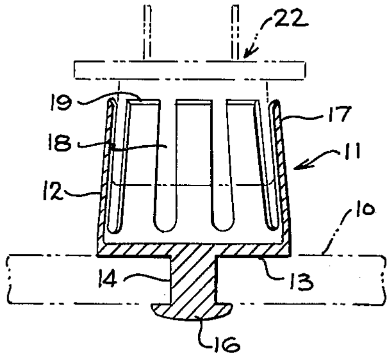
FIGURE 2 is a transverse sectional view of the transistor of FIGURE 1 after it has been attached to the mounting board.
Figure 3:
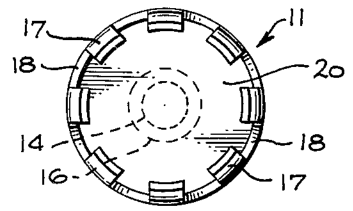
FIGURE 3 is a top view of the transistor of FIGURE 1.
Figure 7:
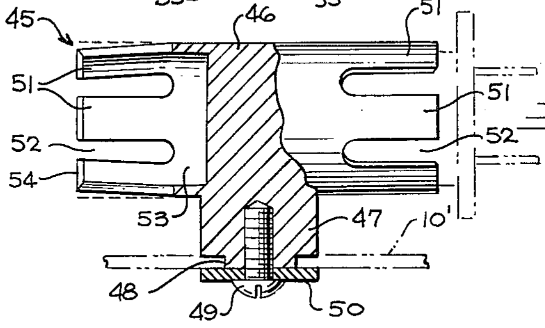
FIGURE 7 is a side elevational view partially broken away of a third modified form of the invention.
Figure 8:
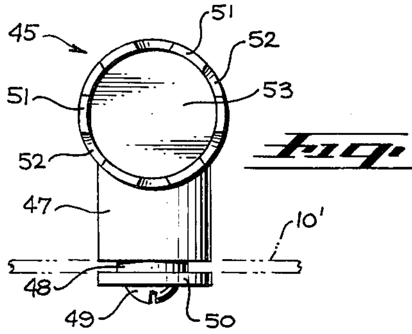
FIGURE 8 is an end elevational view of the form of invention shown in FIGURE 7.

In the form of device illustrated in FIGURES 7 and 8, a body 45 is provided for the accommodation of two transistors at one time mounted in a fashion similar to that shown in FIGURES 1 and 2. The body in this instance has a substantially massive solid mid-portion 46 from which extends a projection 47 outwardly. The projection may include a neck 48 adapted to pass through a mounting board 10′ and be secured thereto by means of a screw 49 extending through a washer 50. The projection 47 is long enough to elevate the body 45 an appreciable distance above the mounting board, in order to amply accommodate the transistors so that they do not engage the mounting board.

The body 45 at each end thereof is provided with a multiplicity of ribs 51 similar to the ribs 17 of FIGURES 1 and 2, separated by corresponding slots 52. The slots are relatively wide in order to improve circulation within an opening 53 within the body. Similarly, an open end 54 admits the transistor in each instance which extends only part way into the opening 53, so that there is a substantially large unoccupied portion of the space at the interior.

The substantially large mass of the mid-portion connected directly to the mounting board 10′ and the improved circulation provided by the large slots 52 extending in opposite directions is such that the circulation of air around the entire body is substantially improved thereby making the efficiency of the dissipator immediately effective. The ribs 51 extend resiliently inwardly, whereby, to firmly grip the transistor casing once it is positioned therein.

Figure 9:
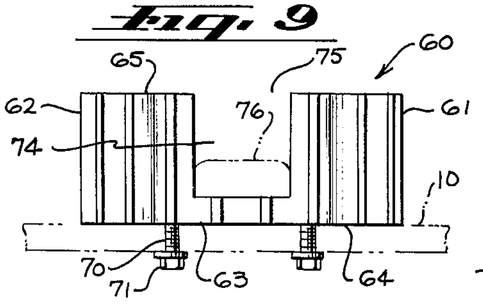
FIGURE 9 is a side elevational view of a fourth form of the invention.
Figure 10:
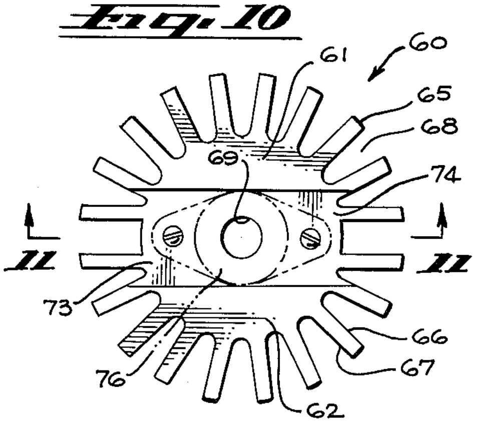
FIGURE 10 is a plan view of the form of invention shown in FIGURE 9.
Figure 11:
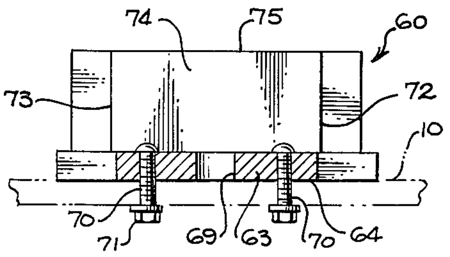
FIGURE 11 is a transverse sectional view taken on the line 11—11 of FIGURE 10.

In the form of invention illustrated in FIGURES 9, 10, and 11, the massive bulkiness of the transistor body 60 is taken advantage of.

In this form of invention the body includes a composite side wall consisting of opposite sides 61 and 62. A base 63 interconnects the side walls and may be considered as extending outwardly beneath both side walls whereby to provide a base surface 64 for engagement with the mounting board 10.

Both of the side walls 61 and 62 are relatively thick at the mid-portion tapering toward the ends, but the overall effect is one comprising a mass of appreciable quantity. In each instance outwardly extending circumferentially spaced ribs 65 having opposite parallel faces 66 and 67 form between them spaces 68, the spaces being substantially wider than the ribs and slightly deeper whereby to provide ready circulation of surrounding air to the sides 61 and 62, respectively. The base 63, moreover, is relatively thick, thicker in fact than the ribs 65, thereby to provide ample mass at the base portion of the body. A hole 69 may extend through the base for the passage of transistor leads. Projections 70, in the form of screws, in the base extend downwardly through the mounting board whereby the body is attached to the board by means of nuts 71 attached to the projections 70. Lateral openings 72 and 73 communicate with a central opening 74 whereby to provide access for the circulation of air to the interior of the body 60. This is assisted further by the provision of an open end 75 as shown.

In the form of invention described in connection with FIGURES 9, 10, and 11 a substantial mass is provided in order to make certain of an immediately available high efficiency heat conducting body which at the same time remains capable of high efficiency. Here also, in addition to the massive character of the body ample opportunity is provided through the slots 68 for contact of circulating air with faces 66 and 67 of the ribs 65, thereby to improve dissipation of heat by the circulation of air therearound as well as the circulation of air through the interior of the body. The massive portion of the body is, consequently, also capable of rapid cooling of the heat accumulated from the heated transistor. In this form of device a transistor 76 normally mounted centrally within the opening 74 as shown and fastened to the base.

Figure 13:
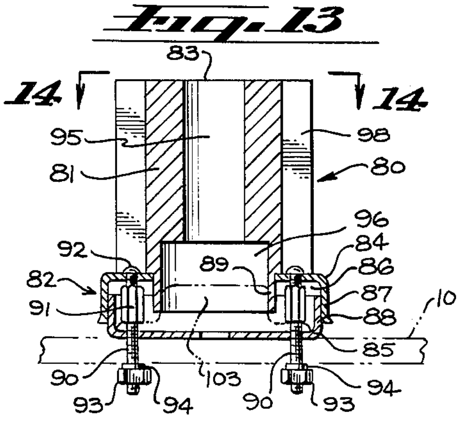
FIGURE 13 is a transverse sectional view of the form of invention shown in FIGURE 12.
Figure 12:
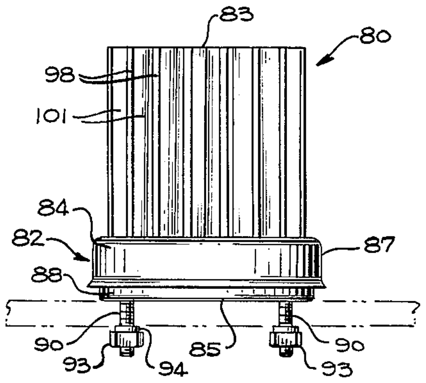
FIGURE 12 is a side elevational view of a fifth modified form of the invention.
Figure 14:
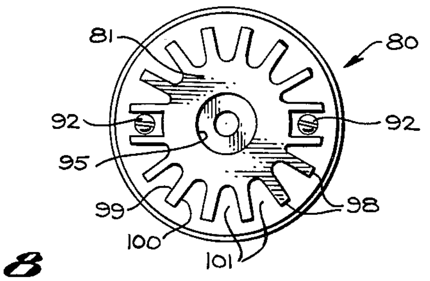
FIGURE 14 is a top view of the form of invention shown in FIGURES 12 and 13 taken on the line 14—14 of FIGURE 13.

In still another form of the invention illustrated in FIGURES 12, 13 and 14 there is provided a body indicated generally by the reference character 80, consisting of a side wall 81, a base indicated generally by the reference character 82 and an open end 83 at the end opposite from the base 82.

In this form of the device the base 82 is of somewhat composite construction consisting of an inner dished portion 84 opening outwardly and an outer dished portion 85 opening inwardly and forming a space 86 therebetween. A flanged perimeter 87 of the inner dished portion overlies a flanged perimeter 88 of the outer dished portion for an appreciable distance. The inner dished portion is shown applied over a reduced end 89 of the side wall 81 where it may be applied by a press fit. Screws 90 at the inner end of which are mounted sleeves 91, serve as a means of attachment of the dished portion 85 to the mounting board. The dished portions 84 and 85 are in turn releasably attached to each other by engagement of screws 92 with the sleeves 91. To secure the composite base to the mounting board 10, nuts 93 employed with lock washers 94 are applied to the screws 90 in the usual conventional fashion. An opening 95 through the interior of the body communicates with an enlargement 96 thereof, which in turn communicates with the space 86. An open end 83 provides access to the opening 95, the opening 95 being at the end of the body opposite from the base 82.

Around the exterior circumference of the side wall 81 are a multiplicity of circumferentially spaced longitudinally extending ribs 98 having opposite parallel faces 99 and 100. The ribs define a corresponding series of spaces 101, which are somewhat wider than the breadth of the ribs and slightly deeper, thereby providing access to the main portion of the side wall 81, as well as providing for the circulation of air in contact with the faces 99 and 100. These factors not only improve the immediate effectiveness but also the overall efficiency of the body.

Although in this instance the base comprise sheet metal dished portions which lack individually the mass of the base of the forms of invention hereinabove described, nevertheless, the side wall 81 is of appreciable mass and by making the dished portions of ample diameter, coupling them together in the fashion shown, and providing a space therebetween as well as surface contact of appreciable extent, the heat transfer capability is kept at a high level and conduction of heat through the base into the mounting board is made possible at appreciable efficiency. At the same time the ample circulation provided both interiorly and exteriorly with respect to the side wall, taking advantage of the ampleness of the spaces, makes for provision of a dissipator having an immediate high efficiency as well as a sustained high efficiency for the transfer of heat away from such transistor as is mounted within the body. In the form of invention of FIGURES 13, 14, and 15 a transistor 103 is normally pressed into the enlargement 96 within the flange wall comprising the reduced end 89 to establish good heat transfer by conduction from the transistor to the side wall 81.

As has been noted throughout the description of the several forms of the invention there has been combined several factors highly instrumental in the provision of transistor heat dissipators of high efficiency, namely, the coupling of relatively great mass with the provision of ample heat dissipating surface, whereby to remove heat from the mass. The conducting away of heat in the several fashions, by use of the structure inherent in all forms of the invention, is a factor which renders these devices highly effective in compacted assemblies, even though there may not be employed an induced circulation of air.

While the invention has herein been shown and described in what is conceived to be the most practical and preferred embodiment, it is recognized that departures may be made therefrom within the scope of the invention, which is not to be limited to the details disclosed herein but is to be accorded the full scope of the claims so as to embrace any and all equivalent devices.

Having described the invention, what is claimed as new in support of Letters Patent is:

1. In a combination of a transistor and a heat dissipator for mounting said transistor with an end thereof facing inwardly, said dissipator comprising a metallic body comprising a side wall, a base and an end opposite said base, said end having an opening therein, said side wall having heat dissipating slots and ribs in alternate relationship, said slots having a breadth not substantially less than the breadth of said ribs and extending axially to positions terminating with said ribs at locations adjacent the base at the respective end of the side wall, said slots and said ribs having a length in excess of the length of said transistor whereby to provide a ventilated space between said end of the transistor and the base, and projection means integrally incorporated in the base and extending from said base whereby to comprise an attachment means for said body and adapted to transfer heat from said body by conduction.

2. In combination a transistor and a heat dissipator for mounting said transistor on a heat sink, a metallic body comprising a side wall, a base and a top, said top having an axially extending opening therein, said side wall having a multiplicity of perimetrally disposed heat dissipating slots and ribs in alternate relationship, the width of said slots being not less than the width of said ribs and the slots extending axially to positions terminating with the ribs at locations adjacent the base at the respective end of the side wall, said ribs and slots having a length substantially greater than the length of the transistor providing thereby a space between the transistor and the base at a location within the side wall, projection means integrally incorporated in the base and extending from said base whereby to comprise an attachment means between said body and the heat sink and adapted to transfer heat from said body to the heat sink by conduction.

3. In combination a transistor and a heat dissipator for supporting a transistor on a heat conducting mounting board, said dissipator including a metallic body comprising a side wall, a base and an end opposite said base, said end having an opening therein for reception of said transistor, said side wall having heat dissipating slots and ribs in alternate spaced relationship, said slots being of breadth not substantially less than the breadth of the ribs, said slots having a length in excess of the length of said transistor, a projection of relatively soft deformable metal integral with the base and extending axially therefrom for a distance greater than the thickness of said mounting board adapted to extend into and engage said mounting board, said projection in finished condition being spread over and into engagement with the mounting board whereby to simultaneously fasten the dissipator to the mounting board and pass a portion of the heat from the base through the projection to the mounting board by conduction.

4. In combination a transistor and a heat dissipator for supporting said transistor on a heat conducting mounting board, a metallic body comprising a side wall, a base and an end opposite said base, said end having an opening therein for reception of a transistor, said side wall having end edge means at the end opposite said base extending around said opening and resiliently inwardly and adapted to grip the transistor, said side wall having heat dissipating slots and ribs in alternate relationship, the slots having a length substantially greater than the length of the transistor and a breadth not substantially less than the breadth of the ribs and providing free circulation of air through the wall to the interior, a projection of relatively soft deformable metal integral with the base and extending axially therefrom for a distance greater than the thickness of said mounting board adapted to extend into and engage said mounting board, said projection in finished condition being spread over and into engagement with the mounting board whertby to simultaneously fasten the dissipator to the mounting board and pass a portion of the heat from the base through said projection to the mounting board by conduction.

5. In combination a transistor and a heat dissipator for supporting said transistor on a heat conducting mounting board, a body comprising a solid circumferentially extending mid-portion forming a base, said base having an integral projection extending radially from said mid-portion thereof adapted to attach the body to the mounting board in heat conducting relationship, side walls on opposite sides of said mid-portion and in axial alignment with each other, said side walls each comprising free standing heat dissipating slots and ribs having a length substantially greater than the length of the transistor, the slots having a breadth not substantially less than the breadth of the ribs and providing free circulation of air through the wall to a location clear of the end of the transistor.

(References on following page)

References Cited by the Examiner

UNITED STATES PATENTS

| | | | |
|---|---|---|---|
| 2,820,929 | 1/58 | Coy | 317—234 |
| 2,820,930 | 1/58 | Coy et al. | 317—234 |
| 2,917,286 | 12/59 | Deakin | 317—234 |
| 2,935,666 | 5/60 | Namen | 317—234 |
| 2,942,165 | 6/60 | Jackson et al. | 317—234 |
| 2,958,515 | 11/60 | Booher | 317—234 |
| 2,964,688 | 12/60 | McAdam | 317—234 |
| 2,994,017 | 7/61 | Kadelburg | 317—234 |

FOREIGN PATENTS

| | | |
|---|---|---|
| 1,064,639 | 9/59 | Germany. |
| 1,076,824 | 3/60 | Germany. |

DAVID J. GALVIN, *Primary Examiner.*

SAMUEL BERNSTEIN, JAMES D. KALLAM, *Examiners.*